(12) United States Patent
    Leobandung

(10) Patent No.: US 10,109,575 B1
(45) Date of Patent: Oct. 23, 2018

(54) NON-PLANAR METAL-INSULATOR-METAL CAPACITOR FORMATION

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/473,782

(22) Filed: Mar. 30, 2017

(51) Int. Cl.
    *H01L 23/522*  (2006.01)
    *H01L 49/02*   (2006.01)
    *H01L 27/08*   (2006.01)
    *H01L 23/528*  (2006.01)
    *H01L 27/22*   (2006.01)

(52) U.S. Cl.
    CPC ...... *H01L 23/5223* (2013.01); *H01L 23/5286* (2013.01); *H01L 27/0805* (2013.01); *H01L 28/40* (2013.01); *H01L 28/60* (2013.01)

(58) Field of Classification Search
    CPC ............. H01L 23/5223; H01L 23/5236; H01L 23/528; H01L 27/224; H01L 27/0805; H01L 27/191; H01L 28/60; H01L 28/40; H01L 28/90; H01G 4/002; H01G 4/005
    See application file for complete search history.

(56) References Cited

U.S. PATENT DOCUMENTS

| 6,977,198 | B2 | 12/2005 | Gau | |
| 7,635,887 | B2* | 12/2009 | Steltenpohl | H01L 23/5223 257/298 |
| 2003/0155603 | A1* | 8/2003 | Liu | H01L 28/90 257/309 |
| 2003/0183862 | A1* | 10/2003 | Jin | H01L 23/5223 257/301 |
| 2011/0298057 | A1* | 12/2011 | Kato | G11C 16/0466 257/392 |

* cited by examiner

*Primary Examiner* — Galina Yushina
(74) *Attorney, Agent, or Firm* — Louis J. Percello; Ryan, Mason & Lewis, LLP

(57) ABSTRACT

A method for forming a semiconductor structure having a non-planar MIM capacitor is provided. The method includes forming a first dielectric layer on a base structure that has one or more recesses each comprising contours formed at two or more planar levels. The first dielectric layer is formed along the contours of the one or more recesses. A first electrode is formed on the first dielectric layer. A second dielectric layer is formed over the first dielectric layer and the first electrode. A second electrode is formed over the second dielectric layer. The first electrode, the second dielectric layer and the second electrode form a non-planar capacitor.

13 Claims, 6 Drawing Sheets

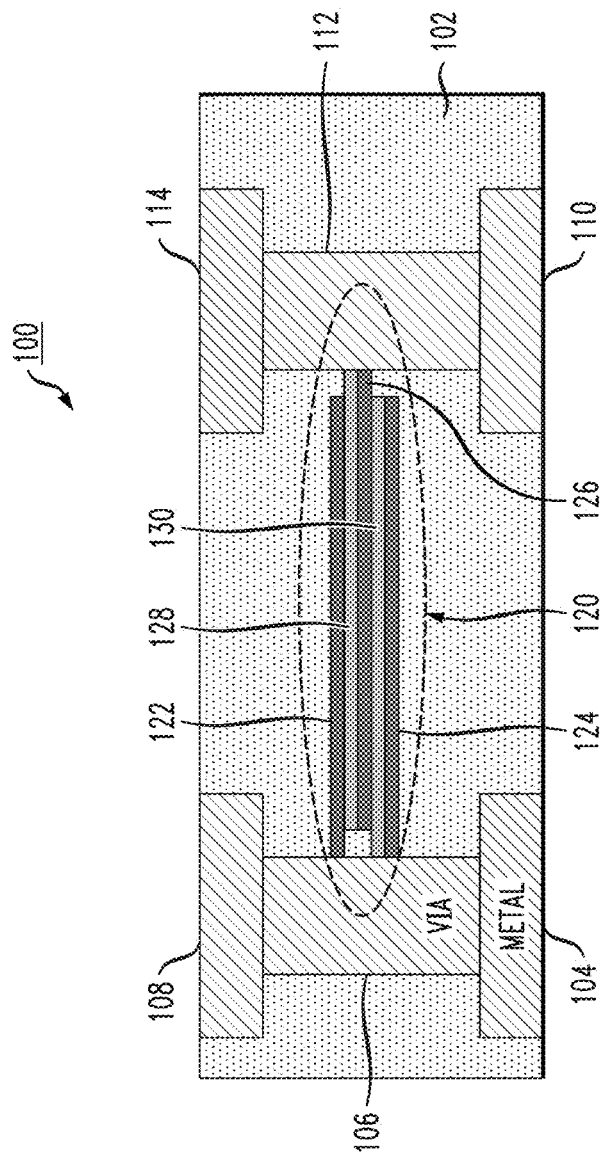

200

200

200

200

200

200

NON-PLANAR METAL-INSULATOR-METAL CAPACITOR FORMATION

BACKGROUND

The present invention relates to forming components in semiconductor integrated circuits, and more specifically to forming metal-insulator-metal (MIM) capacitors.

In semiconductor integrated circuits (ICs or chips), a MIM capacitor may typically be formed as a planar capacitor patterned during a middle-of-line (MOL) process or back-end-of-line (BEOL) process. The term BEOL generally refers to the portion of integrated circuit fabrication during which interconnects are formed. However, the planar MIM capacitor can consume a significant amount of chip area in order to achieve a required amount of capacitance. Attempts have been made to increase the capacitance density by reducing the thickness of the dielectric layer formed between top and bottom metal electrodes and by using high dielectric constant materials. However, reducing the dielectric thickness can lead to undesired effects such as increased leakage currents. Additionally, the use of special dielectric materials may not be cost effective.

SUMMARY

Illustrative embodiments of the invention provide techniques for fabricating semiconductor structures comprising non-planar MIM capacitors. While illustrative embodiments are well-suited to improve operations of MIM capacitors, alternative embodiments may be implemented with other types of semiconductor structures.

For example, in one illustrative embodiment, a method for fabricating a semiconductor structure comprising a non-planar MIM capacitor is provided. The method comprises forming a first dielectric layer on a base structure that has one or more recesses each comprising contours formed at two or more planar levels. The first dielectric layer is formed along the contours of the one or more recesses. A first electrode is formed on the first dielectric layer. A second dielectric layer is formed over the first dielectric layer and the first electrode. A second electrode is formed over the second dielectric layer. The first electrode, the second dielectric layer and the second electrode form a non-planar capacitor.

BRIEF DESCRIPTION OF THE DRAWINGS

FIG. 1 is a prior art cross-sectional view of a semiconductor die having a conventional planar layout of a metal-insulator-metal (MIM) capacitor.

DETAILED DESCRIPTION

Figure 2A:
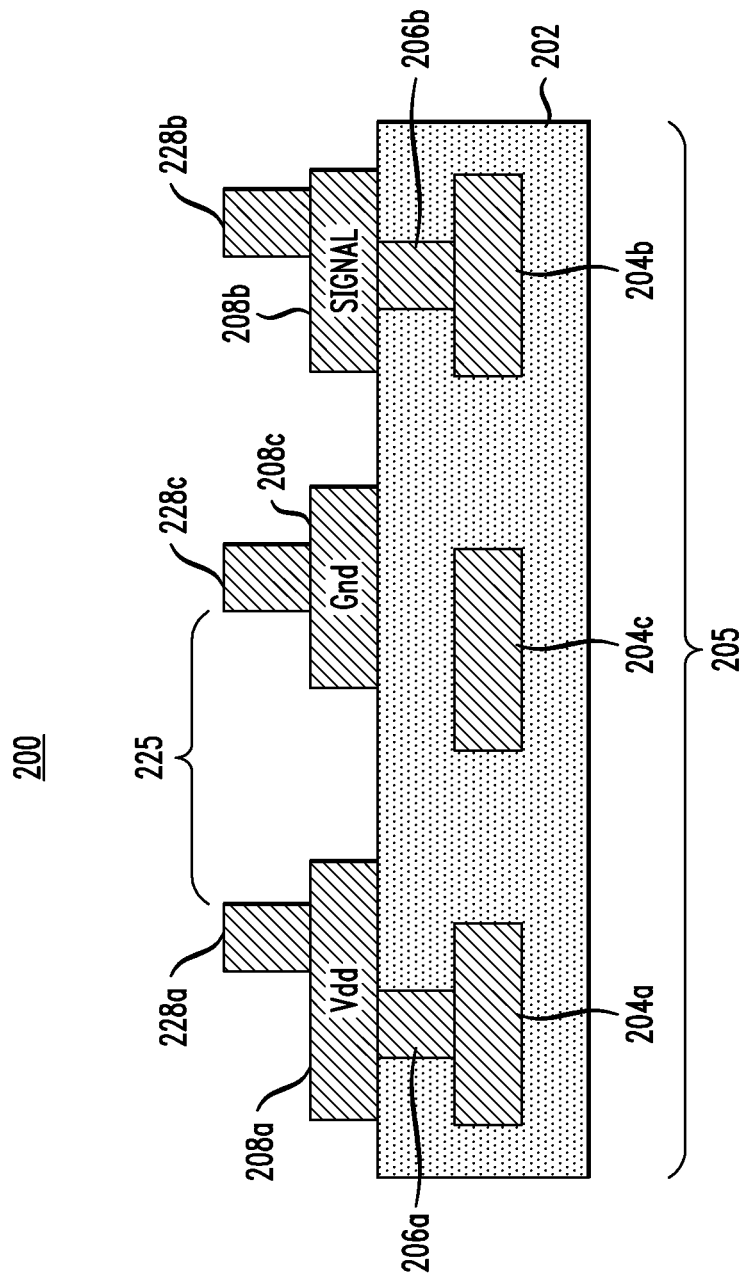
FIG. 2A is a cross-sectional view of a portion of a semiconductor structure at a first-intermediate MIM capacitor formation stage, according to an embodiment of the invention.

Embodiments will now be described in further detail with regard to techniques for forming a non-planar MIM capacitor in a subtractive BEOL process flow. It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

Before describing illustrative embodiments, a semiconductor structure with a planar MIM capacitor will be described in the context of FIG. 1.

Referring now to FIG. 1, a conventional semiconductor die structure 100 is illustrated. For example, structure 100 comprises a dielectric layer 102. In one embodiment, a first metal layer comprising metal lines 104 and 110, a second metal layer comprising metal lines 108 and 114, metal via 106 connecting metal line 104 to metal line 108, and metal via 112 connecting metal line 110 to metal line 114 are formed within dielectric layer 102.

MIM capacitor 120 is formed between via 106 and via 112. Via 106 may be connected to a power supply (Vdd) (not shown) through metal lines 104 and 108, while via 112 may be connected to power supply ground (Gnd) (not shown) through metal lines 110 and 114. However, connections to MIM capacitor 120 are not limited to being between power and ground, but may also be between a signal line and ground, a signal line and power, a first signal and a second signal, etc.

In order to increase capacitance, MIM capacitor 120 is formed with top electrode 122 and bottom electrode 124, both connected to via 106, and middle electrode 126 connected to via 112. Middle electrode 126 is stacked in between top electrode 122 and bottom electrode 124 as illustrated in FIG. 1. Middle electrode 126 is insulated from top electrode 122 and bottom electrode 124 by dielectric layers 128 and 130, respectively. In one embodiment, dielectric layers 128 and 130 are comprised of a high-k dielectric material.

With reference to FIGS. 2A-2H, illustrative embodiments regarding the formation of a MIM capacitor during a subtractive BEOL process will now be described. The illustrative embodiments provide a process flow that will work with a subtractive BEOL process, and that advantageously results in an increase in MIM capacitor area without an increase in semiconductor die area.

FIG. 2A illustrates a cross-sectional view of a portion of semiconductor structure 200 at a first-intermediate stage. FIG. 2A depicts a typical subtractive BEOL layer with metal layer below. Formed within dielectric layer 202 are metal lines 204a, 204b and 204c and vias 206a and 206b. Formed above dielectric layer 202 are metal lines 208a, 208b and 208c. As shown in this illustrative embodiment, metal line 208a is a Vdd line, metal line 208b is a signal line and metal line 208c is Gnd line. Metal lines 208a-c may be comprised of any metal suitable for the embodiments described herein. Via 206a connects metal line 204a with metal line 208a and via 206b connects metal line 204b with metal line 208b. Structure 200 further includes via 228a formed on metal line 208a, via 228b formed on metal line 208b, and via 228c formed on metal line 208c. The structure depicted in FIG. 2A is referred to herein as base structure 205.

Although the embodiments described in FIGS. 2A-2H illustrate the formation of a MIM capacitor in which the electrodes are connected to the Vdd and Gnd metal lines, respectively, in other embodiments, the metal lines may be connected to signals other than Vdd and Gnd. Accordingly, the embodiments described herein should not be considered limiting.

Generally, the base structure may have one or more recesses each formed at two or more planar levels. As shown in this illustrative example, base structure 205 has four recesses, including recess 225. Referring back to the illustrative example of FIG. 2A, recess 225 is formed at three planar levels, defined by the top surfaces of vias 228a and 228c, the top surfaces of metal lines 208a and 208c, and the top surface of dielectric layer 202. It should be understood and appreciated that the number of recesses and associated planar levels formed within the base structure should not be considered limiting.

It is to be assumed that the base structure shown in FIG. 2A was formed via a subtractive BEOL process. For example, the recesses of the base structure are assumed to be formed via a subtractive BEOL process. A subtractive BEOL process provides more variability in topology, and thus more surface area. According to the illustrative embodiments described herein, the process of forming a MIM capacitor during a subtractive BEOL process advantageously increases capacitance of the MIM capacitor while reducing the consumed chip area.

Figure 2B:
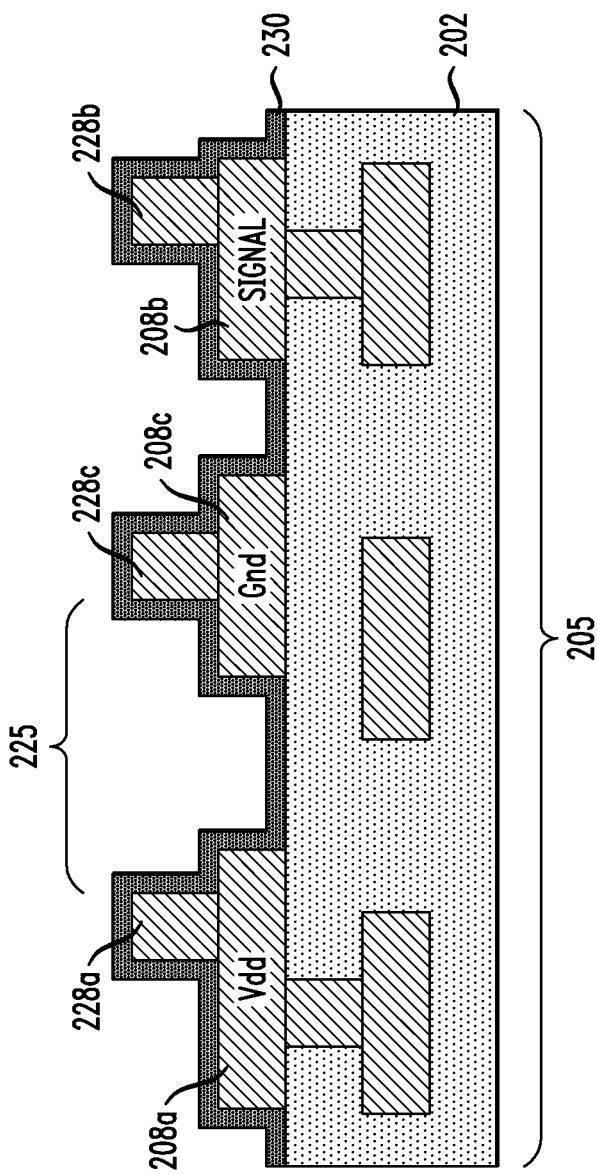
FIG. 2B is a cross-sectional view of a portion of a semiconductor structure at a second-intermediate MIM capacitor formation stage, according to an embodiment of the invention.

FIG. 2B illustrates a cross-sectional view of a portion of semiconductor structure 200 at a second-intermediate stage. As shown in FIG. 2B, dielectric cap layer 230 is formed over base structure 205 by depositing and patterning a dielectric material. Any dielectric material may be used to form dielectric cap layer 230, in accordance with the embodiments described herein. For example, in one embodiment, dielectric cap layer 230 is comprised of a low-k dielectric material. As shown, dielectric cap layer 230 is formed along the contours of the recesses of base structure 205 (e.g., along the contours of recess 225). Dielectric cap layer 230 may be formed via any deposition process in accordance with the embodiments described herein.

Figure 2C:
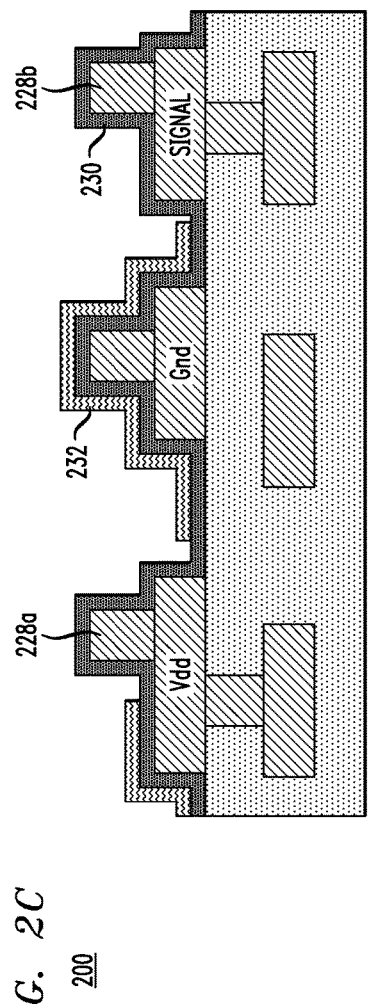
FIG. 2C is a cross-sectional view of a portion of a semiconductor structure at a third-intermediate MIM capacitor formation stage, according to an embodiment of the invention.

FIG. 2C illustrates a cross-sectional view of a portion of the semiconductor structure 200 at a third-intermediate stage. As shown in FIG. 2C, electrode 232 is formed on dielectric cap layer 230, and is patterned and etched away from around via 228a and via 228b in the manner depicted in FIG. 2C. Electrode 232 may be comprised of any material suitable for use in accordance with the embodiments described herein. For example, electrode 232 may be comprised of titanium, titanium nitride, tantalum nitride, tungsten, aluminum, etc. Electrode 232 may be formed via any deposition process, in accordance with the embodiments described herein.

Figure 2D:
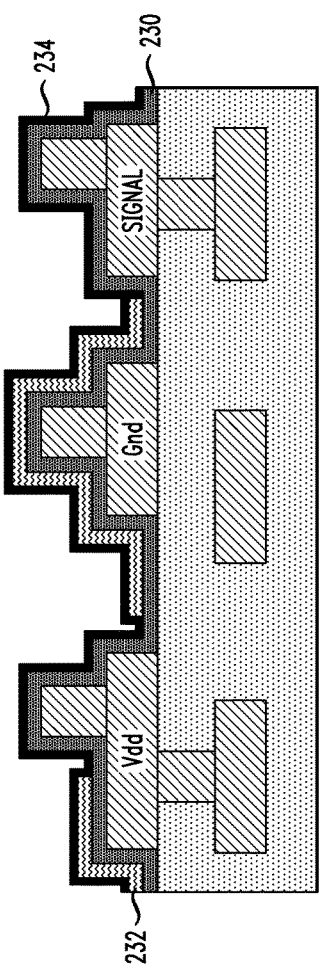
FIG. 2D is a cross-sectional view of a portion of a semiconductor structure at a fourth-intermediate MIM capacitor formation stage, according to an embodiment of the invention.

FIG. 2D illustrates a cross-sectional view of a portion of semiconductor structure 200 at a fourth-intermediate stage. As shown in FIG. 2D, dielectric layer 234 is formed over the surfaces of dielectric cap layer 230 and electrode 232. Any dielectric material may be used to form dielectric cap layer 230, in accordance with the embodiments described herein. For example, in one embodiment, dielectric layer 234 comprises a high-k dielectric material. Dielectric layer 234 may be formed via any deposition process in accordance with the embodiments described herein.

Figures 2E, 2F:
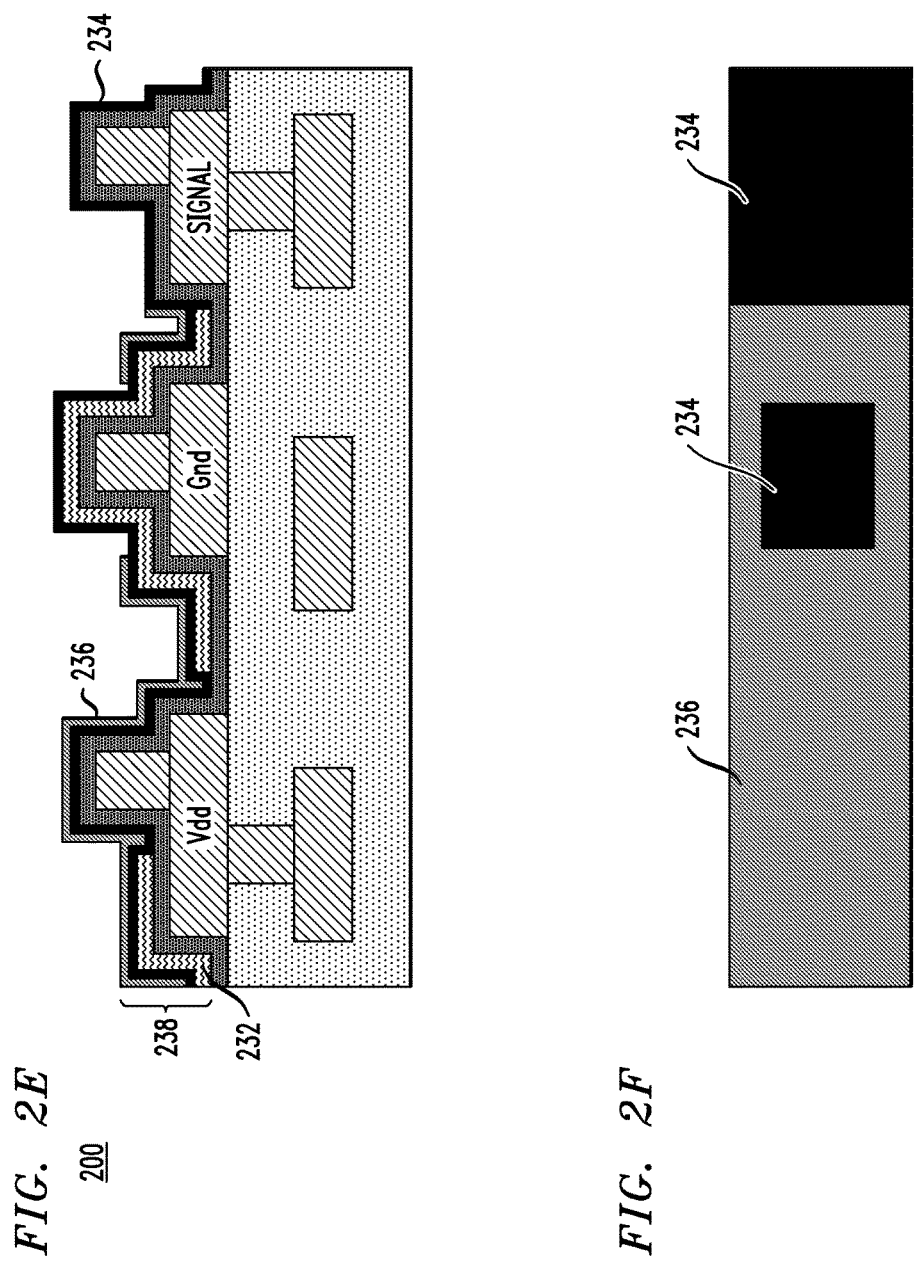
FIG. 2E is a cross-sectional view and a corresponding top-down view of a portion of a semiconductor structure at a fifth-intermediate MIM capacitor formation stage, according to an embodiment of the invention.
FIG. 2F is a top-down view of a portion of a semiconductor structure at the fifth-intermediate MIM capacitor formation stage, according to an embodiment of the invention.

FIG. 2E illustrates a cross-sectional view of a portion of semiconductor structure 200 at a fifth-intermediate stage. As shown in FIG. 2E, electrode 236 is formed over dielectric layer 234, and is then patterned and etched away from around Gnd and the signal wire. Electrode 236 may be comprised of any material suitable for use in accordance with the embodiments described herein. For example, electrode 236 may be comprised of titanium, titanium nitride, tantalum nitride, tungsten, aluminum, etc. Electrode 236 may be formed via any deposition process, in accordance with the embodiments described herein. Dielectric layer 234 serves as an insulator between electrodes 232 and 236. FIG. 2F illustrates a top-down view corresponding to the portion of semiconductor structure 200 at the fifth-intermediate stage.

Electrode 232, dielectric layer 234 and electrode 236 form capacitor 238. Capacitor 238 may be referred to as a MIM capacitor, due to the metal-insulator-metal arrangement of electrode 232, dielectric layer 234 and electrode 236. Capacitor 238 is non-planar due to the deposition of each component following the contours of the recesses of the base structure, since the recesses have multiple planar levels.

Figure 2G:
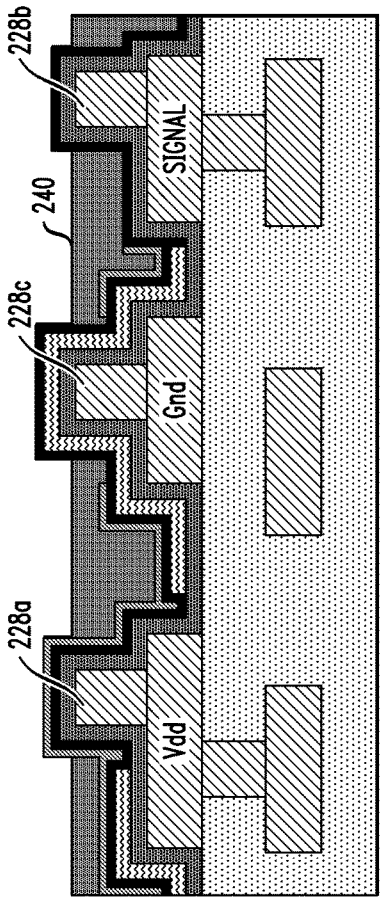
FIG. 2G is a cross-sectional view of a portion of a semiconductor structure at a sixth-intermediate MIM capacitor formation stage, according to an embodiment of the invention.

FIG. 2G illustrates a cross-sectional view of a portion of semiconductor structure 200 at a sixth-intermediate stage. As shown in FIG. 2G, the recesses of the base structure (e.g., recess 225) are filled with insulator 240. In one embodiment, insulator 240 is a dielectric. Insulator 240 may be comprised of any material suitable for use as an insulator in accordance with the embodiments described herein. The recesses of the base structure may be filled via any process in accordance with the embodiments described herein. As further shown in FIG. 2G, structure 200 is planarized down to the top surfaces of vias 228a-228c, leaving the top metal of Vdd, Gnd and signal wires exposed. Any planarization process may be used in accordance with the embodiments described herein.

Figure 2H:
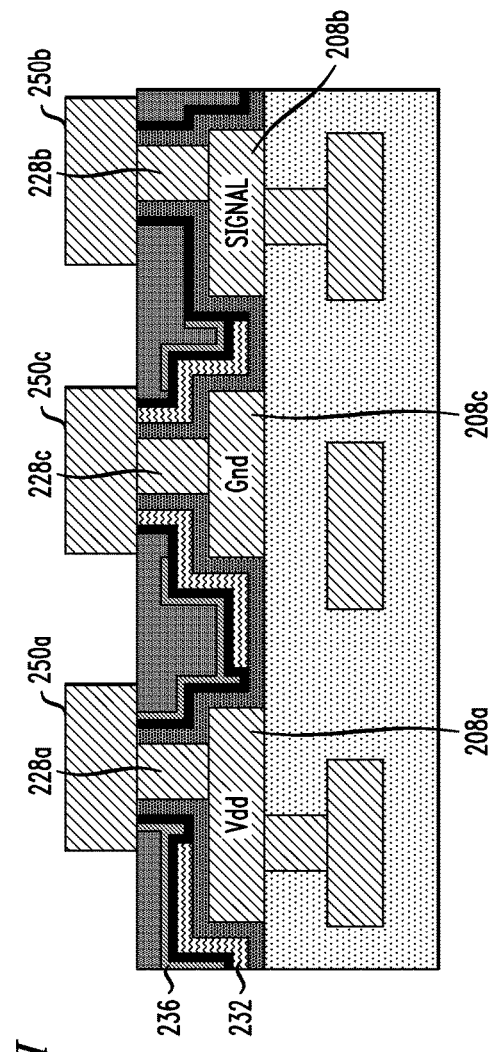
FIG. 2H is a cross-sectional view of a portion of a semiconductor structure at a seventh-intermediate MIM capacitor formation stage, according to an embodiment of the invention.

FIG. 2H illustrates a cross-sectional view of a portion of semiconductor structure 200 at a seventh-intermediate stage. As shown in FIG. 2H, metals 250a-250c are formed on vias 228a-228c. In one embodiment, metals 250a-250c are metal lines and/or bonding metals associated with a next level of structure 200 (e.g., C4 connections or higher level metallization). Metals 250a-250c provide an electrical connection with their corresponding vias 228a-228c, as well as electrodes 232 and 236. As illustrated in FIG. 2H, metal 250a makes an electrical connection to metal 208a and electrode 236, and metal 250c makes an electrical connection to metal 208c and electrode 232. Metals 250a-250c may be comprised of any metal material suitable for use in accordance with the embodiments described herein, and may be formed using any process in accordance with the embodiments described herein.

It is to be understood that the illustrative embodiments of FIGS. 2A-2H depict the formation of a semiconductor structure having a single MIM capacitor stack. However, any number of MIM capacitor stacks may be formed in accordance with the embodiments described herein.

The embodiments described herein provide for the formation of a non-planar MIM capacitor. Such a non-planar structure provides for an increased surface area of the MIM capacitor over a given region, as compared to a conventional MIM capacitor, such as MIM capacitor 120 depicted in FIG. 1. Accordingly, the non-planar MIM capacitor of the semiconductor structure described herein advantageously provides for a higher capacitance over a given region as compared to a conventional planar MIM capacitor.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:
1. A method comprising:
   forming a first dielectric layer on a base structure, wherein the base structure has one or more recesses each comprising contours formed at two or more planar levels, wherein the base structure comprises:
   a dielectric;
   a first set of base structures formed in the dielectric, the first set of base structures comprising at least a first base structure, a second base structure and a third base structure; and
   a second set of base structures formed on the dielectric and the first set of base structures, the second set of base structures comprising at least a fourth base structure, a fifth base structure and a sixth base structure, and wherein the first dielectric layer is formed along the contours of the one or more recesses;
   forming a first electrode on the first dielectric layer;
   forming a second dielectric layer over the first dielectric layer and the first electrode; and
   forming a second electrode over the second dielectric layer;
   wherein the first electrode, the second dielectric layer and the second electrode form a non-planar capacitor.

2. The method of claim 1, wherein the first dielectric layer comprises a low-k dielectric material.

3. The method of claim 1, wherein the second dielectric layer comprises a high-k dielectric material.

4. The method of claim 1, wherein forming the first electrode comprises depositing a first electrode layer on the first dielectric layer, etching a first portion of the deposited first electrode layer around the fourth base structure, and etching a second portion of the deposited first electrode layer around the fifth base structure.

5. The method of claim 1, wherein forming the second electrode comprises depositing a second electrode layer on the second dielectric layer, etching a first portion of the deposited second electrode layer around the fifth base structure, and etching a second portion of the deposited second electrode layer around the sixth base structure.

6. The method of claim 1, wherein the first base structure comprises a first via having a first surface formed on a first metal line, wherein the second base structure comprises a second via having a first surface formed on a second metal line, and wherein the third base structure comprises a third metal line.

7. The method of claim 6, wherein the fourth base structure comprises a fourth via having a first surface formed on a first surface of a fourth metal line, wherein the fifth base structure comprises a fifth via having a first surface formed on a first surface of a fifth metal line, and wherein the sixth base structure comprises a sixth via having a first surface formed on a first surface of a sixth metal line.

8. The method of claim 7, wherein the fourth metal line is a Vdd line, wherein the fifth metal line is a signal line, and wherein the sixth metal line is a Gnd line.

9. The method of claim 7, wherein the first via has a second surface abutting a second surface of the fourth metal line, and wherein the second via has a second surface abutting a second surface of the fifth metal line.

10. The method of claim 7, further comprising filling the one or more recesses with an insulator after forming the second electrode, and planarizing down the entire structure to top surfaces of the fourth via, the fifth via and the sixth via.

11. The method of claim 10, further comprising depositing first, second and third metals on each of the fourth, fifth and sixth vias, respectively.

12. The method of claim 11, wherein the first metal makes an electrical connection with the second electrode and the fourth metal line, wherein the second metal makes an electrical connection with the first electrode and the fifth metal line, and wherein the third metal makes an electrical connection with the first electrode and the sixth metal line.

13. The method of claim 1, wherein the one or more recesses of the structure are formed via a subtractive back-end-of-line process.

* * * * *